United States Patent [19]
Hirota

[11] Patent Number: 5,597,760
[45] Date of Patent: Jan. 28, 1997

[54] PROCESS OF FABRICATING SEMICONDUCTOR DEVICE HAVING CAPACITOR INCREASED IN CAPACITANCE BY ROUGHENING SURFACE OF ACCUMULATING ELECTRODE

[75] Inventor: Toshiyuki Hirota, Tokyo, Japan

[73] Assignee: NEC Corporation, Japan

[21] Appl. No.: 589,268

[22] Filed: Jan. 22, 1996

[30] Foreign Application Priority Data

Jan. 25, 1995 [JP] Japan ................... 7-009834

[51] Int. Cl.$^6$ ................................. H01L 21/70
[52] U.S. Cl. ................. 437/60; 437/47; 437/52; 437/919; 148/DIG. 14; 148/DIG. 138
[58] Field of Search ................. 437/47, 52, 60, 437/106, 109, 247, 919; 148/DIG. 14, DIG. 138

[56] References Cited

U.S. PATENT DOCUMENTS

| | | |
|---|---|---|
| 5,112,773 | 5/1992 | Tuttle . |
| 5,208,479 | 5/1993 | Mathews et al. ............ 437/919 |
| 5,244,842 | 9/1993 | Cathey et al. ............... 437/919 |
| 5,266,514 | 11/1993 | Tuan et al. .................. 437/52 |
| 5,372,962 | 12/1994 | Hirota et al. ................ 437/919 |
| 5,444,011 | 8/1995 | Taniguchi ................... 437/60 |
| 5,445,986 | 8/1995 | Hirota ....................... 437/919 |
| 5,488,008 | 1/1996 | Kawamura ................... 437/919 |

FOREIGN PATENT DOCUMENTS

| | | |
|---|---|---|
| 0557590A1 | 9/1993 | European Pat. Off. . |
| 3-139882 | 6/1991 | Japan . |
| 4286152A | 10/1992 | Japan . |
| 6125051A | 5/1994 | Japan . |
| 7-74317 | 3/1995 | Japan . |

*Primary Examiner*—Tuan H. Nguyen
*Attorney, Agent, or Firm*—Laff, Whitesel, Conte & Saret, Ltd.

[57] ABSTRACT

Boundary layers of silicon nitride not greater than 1 nanometer thick are inserted between adjacent two phosphorous-doped polysilicon layers forming parts of an accumulating electrode of a capacitor so as to decrease the grain size of the polysilicon and, accordingly, increase the grain boundaries exposed to the surfaces of the phosphorous-doped polysilicon layers, and hot phosphoric acid selectively etches the grain boundaries, thereby increasing the surface area of the phosphorous-doped polysilicon layers.

16 Claims, 11 Drawing Sheets

5,597,760

PROCESS OF FABRICATING SEMICONDUCTOR DEVICE HAVING CAPACITOR INCREASED IN CAPACITANCE BY ROUGHENING SURFACE OF ACCUMULATING ELECTRODE

FIELD OF THE INVENTION

This invention relates to a semiconductor device and, more particularly, to a process of fabricating a semiconductor device having a capacitor increased in capacitance by roughening a surface of an accumulating electrode.

DESCRIPTION OF THE RELATED ART

A capacitor is one of the important circuit components of a semiconductor integrated circuit device. For example, a semiconductor dynamic random access memory device incorporates a large number of dynamic random access memory cells for storing bits of data information, and the standard dynamic random access memory cell is implemented by a series of a switching transistor and a storage capacitor.

The integration density of the dynamic random access memory device is getting higher and higher, and the storage capacitor is progressively miniaturized. The storage capacitor is expected to occupy extremely narrow area. However, the data bit is stored in the form of electric charge accumulated in the storage capacitor. If the amount of electric charge is too small to maintain the data bit for predetermined time period, the dynamic random access memory cell is not reliable as a data storage, and the manufacturer is required to shrink the occupation area assigned to the storage capacitor without reduction of the accumulated electric charge.

In order to decrease the occupation area without reduction of the accumulated electric charge, three-dimensional capacitors have been proposed. A trench-type storage capacitor and a stacked capacitor are typical examples of the three-dimensional capacitor. There is a trade-off between the trench-type storage capacitor and the stacked type storage capacitor. One of the attractive points of the stacked capacitor is a highly resistive feature against the alpha particles and a noise from an adjacent signal line and peripheral circuits. This feature is conducive to a stability of the circuit behavior, and enhances the reliability of the semiconductor dynamic random access memory device as a data storage. For this reason, it is considered that the stacked capacitor is desirable for a 1 giga-bit semiconductor dynamic random access memory device planed under the design rules of 0.15 micron.

When 1 giga-bit dynamic random access memory cells are fabricated on a small silicon chip together with circuit components of peripheral circuits, it is necessary for the manufacturer to decrease the area assigned to each dynamic random access memory cell without reduction of the accumulated electric charge. The amount of electric charge is proportional to the surface area of the accumulating electrode, and Japanese Patent Publication No. 5-219370 teaches an enlargement of the surface area of the accumulating electrode by using a roughening technology.

FIGS. 1A to 1D illustrates the prior art process for forming the stacked capacitor disclosed in the Japanese Patent Application. First, an n-type dopant impurity is introduced into a p-type silicon substrate 1, and forms an impurity region 1a. Though not shown in FIGS. 1A to 1D, the impurity region 1a serves as an n-type source region of a switching transistor.

Subsequently, silicon oxide is deposited to 100 nanometers to 300 nanometers thick by using an atmospheric pressure chemical vapor deposition, and forms an inter-level insulating layer 2. An appropriate photo-resist mask (not shown) is formed on the inter-level insulating layer 2 by using lithographic techniques. The photo-resist mask exposes a part of the inter-level insulating layer 2 over the n-type impurity region 1a, and the exposed part is removed through a dry etching so as to form a contact hole 2a.

Subsequently, polysilicon is deposited to 200 to 400 nanometers thick over the entire surface of the structure by using a low-pressure chemical vapor deposition, and the polysilicon forms a polysilibon layer 3 held in contact through the contact hole 2a with the n-type impurity region 1a. The deposited polysilicon forms column-shaped grains 3a as shown in FIG. 2A, and grain boundaries 3b extend in the vertical direction to the upper surface 3c thereof. The resultant structure in this stage is illustrated in FIG. 1A.

Phosphorous is thermally diffused into the polysilicon layer 3, and the polysilicon layer 3 is doped with the phosphorous at $10^{20}$ cm$^{-3}$.

An appropriate photo-resist mask is formed on the upper surface of the phosphorous-doped polysilicon layer 3 through the lithographic process, and the phosphorous-doped polysilicon layer 3 is patterned into a phosphorous-doped polysilicon strip 3d by using a dry etching. The resultant stage in this stage is illustrated in FIG. 1B.

Subsequently, the phosphorous-doped polysilicon strip 3d is roughened as follows. First, the phosphorous-doped polysilicon strip 3d is dipped in phosphoric acid solution at 140 to 170 degrees in centigrade for 60 to 90 minutes. The phosphorous segregates in the grain boundaries 3b and crystal defects, and the hot phosphoric acid selectively etches the grain boundaries 3b and the crystal defects. As a result, deep crevasses 3e take place at the grain boundaries 3b, and the surface portion 3f becomes porous as shown in FIG. 2B.

The phosphorous-doped polysilicon strip 3d is etched by using an isotropical etchant without impurity concentration dependency. A typical example of the etchant is mixture of ammonia-hydrogen peroxide diluted in pure water. The etchant removes the porous polysilicon 3f, and widens the crevasses 3e as shown in FIG. 2C.

The entire surface of the phosphorous doped polysilicon strip 3d is roughened, and an accumulating electrode 4a is formed from the phosphorous-doped polysilicon strip 3d as shown in FIG. 1C.

Subsequently, the accumulating electrode 4a is treated with diluted hydrofluoric acid solution, and natural oxide is etched away from the accumulating electrode 4a. Silicon nitride is deposited to 5 to 10 nanometers thick over the entire surface of the structure by using a low-pressure chemical vapor deposition, and the silicon nitride layer serves as a dielectric film 4b of the storage capacitor 4.

Finally, polysilicon is deposited to 200 to 300 nanometers thick over the dielectric film 4b by using the low pressure chemical vapor deposition, and phosphorous is thermally diffused into the polysilicon layer. The phosphorous-doped polysilicon layer serves as a counter electrode 4c of the stacked type storage capacitor 4, and the resultant structure is illustrated in FIG. 1D.

Thus, the accumulating electrode 4a is increased in surface area through the two-stage roughening process, i.e., the selective etching stage for the grain boundaries 3b and the crystal defects and the isotropical etching stage for enlarging the crevasses 3e. The prior art process shown in FIGS. 1A to 1D is simpler than the other prior art processes for fabricating a fin-type storage capacitor and a cylinder-type storage capacitor, and decreases the production cost.

However, the prior art two-stage roughening process can not provide a sufficiently wide rough surface for a storage capacitor available for a semiconductor dynamic random access memory device of the next generation.

In detail, the prior art two-stage roughening process starts with preparation of the column-shaped grains 3a, and the hot phosphoric acid solution firstly attacks the grain boundaries 3b exposed to the upper surface 3c in the first stage. The crevasses 3e downwardly penetrate from the grain boundaries 3b exposed to the upper surface 3c, and the crevasses 3e is enlarged in the second stage. Therefore, the increment of the surface area is strongly dependent on the grain boundaries initially exposed to the upper surface 3c. The grain size determines the amount of the grain boundaries exposed to the upper surface 3c, and the grain size is shrunk by decreasing the thickness of the doped polysilicon layer 3. Thus, a thin doped polysilicon is desirable for the increment of the surface area through the surface roughening.

On the other hand, if the accumulating electrode 4a is decreased in thickness, the side surface is also decreased. Therefore, a thick doped polysilicon layer 3 is desirable for the increment of the surface area in view of the side surface. Thus, there is a trade-off between the side surface and the rough surface, and there is a limit on the surface area increased through the prior art two-stage roughening process.

SUMMARY OF THE INVENTION

It is therefore an important object of the present invention to provide a process of fabricating a semiconductor device a capacitor of which is widely increased in capacitance.

To accomplish the object, the present invention proposes to repeatedly discontinue a crystal growth of polysilicon so as to decrease the grain size of the polysilicon.

In accordance with one aspect of the present invention, there is provided a process of fabricating a semiconductor device, comprising the steps of: a) introducing an element selected from the group consisting of oxygen, nitrogen and carbon into a polysilicon layer during a period of a deposition of the polysilicon layer; b) exposing a surface of the polysilicon layer to an etchant so as to roughen the surface; c) covering the surface of the polysilicon layer with a dielectric layer; and d) covering the dielectric layer with a conductive layer.

In accordance with another aspect of the present invention, there is provided a process of fabricating a semiconductor device, comprising the steps of: a) preparing a semiconductor structure; b) forming a multi-level polysilicon strip structure over the semiconductor structure and including a plurality of polysilicon strips doped with a dopant impurity of group V or group III and at least one boundary strip inserted between two of the plurality of polysilicon strips so as to intercept a crystal growth of polysilicon between the aforesaid two of the plurality of polysilicon strips; c) roughening surfaces of the multi-level polysilicon strip structure by forming deep crevasses along grain boundaries of the polysilicon, thereby forming an accumulating electrode; d) covering the accumulating electrode with a dielectric film structure; and e) covering the dielectric film structure with a counter electrode so as to complete a capacitor.

The at least one boundary layer may be formed of silicon nitride, polysilicon containing silicon nitride, oxygen, silicon oxide or carbon.

In accordance with yet another aspect of the present invention, there is provided a process of fabricating a semiconductor device, comprising the steps of: a) preparing a semiconductor structure; b) forming a polysilicon strip over the semiconductor structure through a vapor phase deposition using a process gas containing $N_2O$ gas so as to decrease a grain size of polysilicon, the polysilicon strip being doped with an element of group V or group III segregated along grain boundaries of the polysilicon strip; c) roughening surfaces of the polysilicon strip by forming deep crevasses along the grain boundaries, thereby forming an accumulating electrode from the polysilicon strip; d) covering the accumulating electrode with a dielectric film structure; and e) covering the dielectric film structure with a counter electrode so as to complete a capacitor.

The vapor phase deposition may firstly an amorphous silicon layer which is converted to the polysilicon strip at a later stage.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
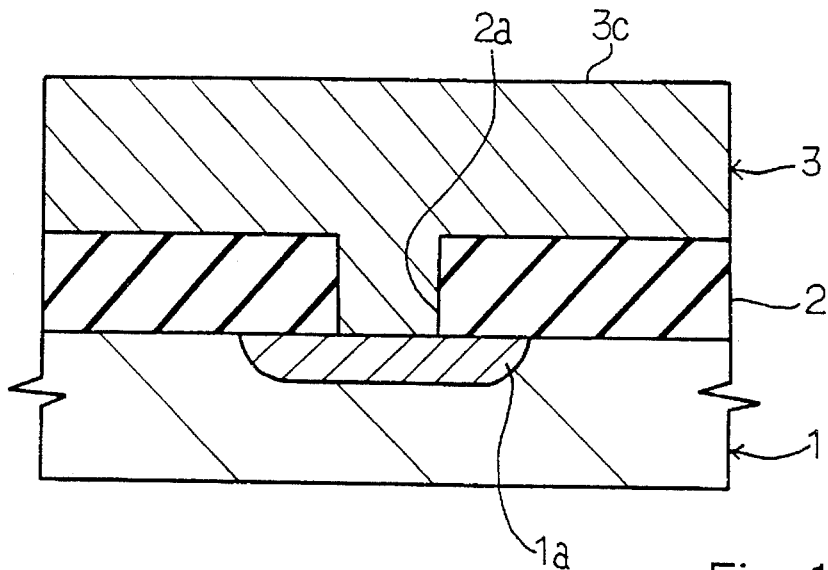
FIGS. 1A to 1D are cross sectional views showing the prior art process sequence disclosed in Japanese Patent Application No. 5-219370.
Figure 1B:
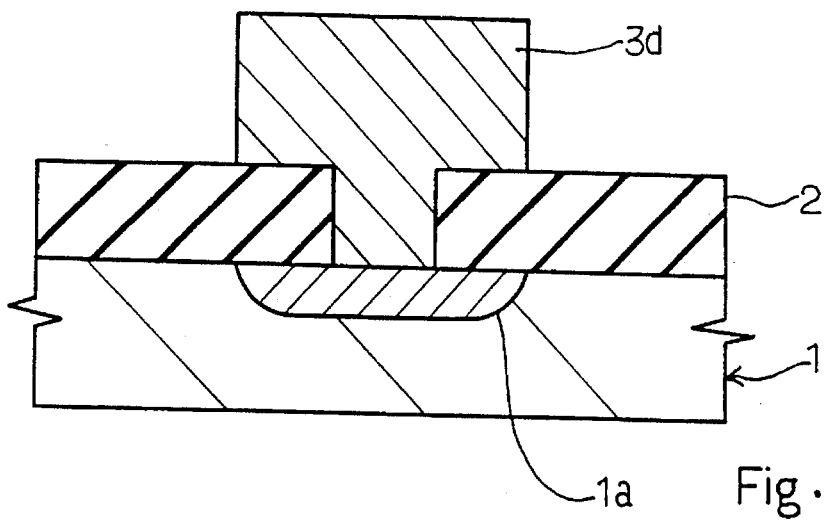
Figure 1C:
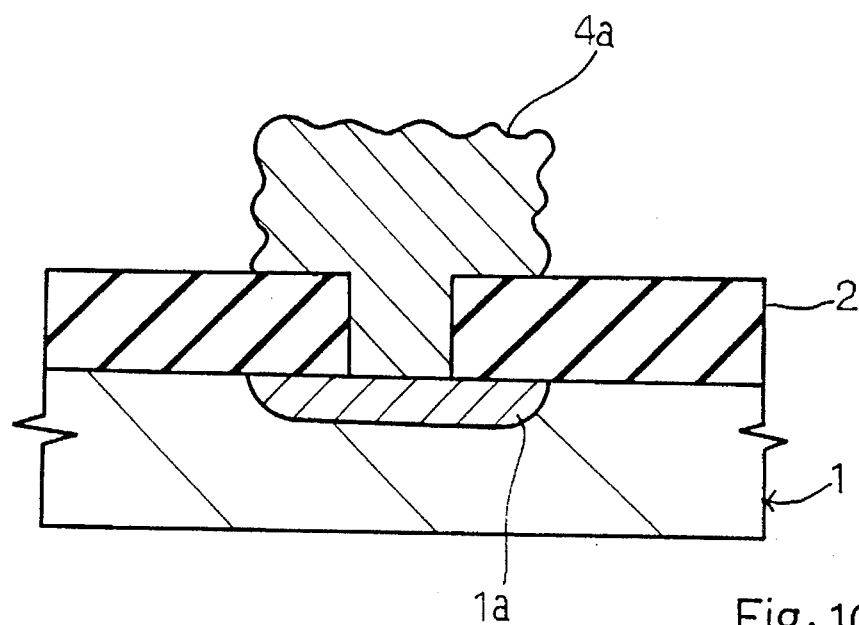
Figure 1D:
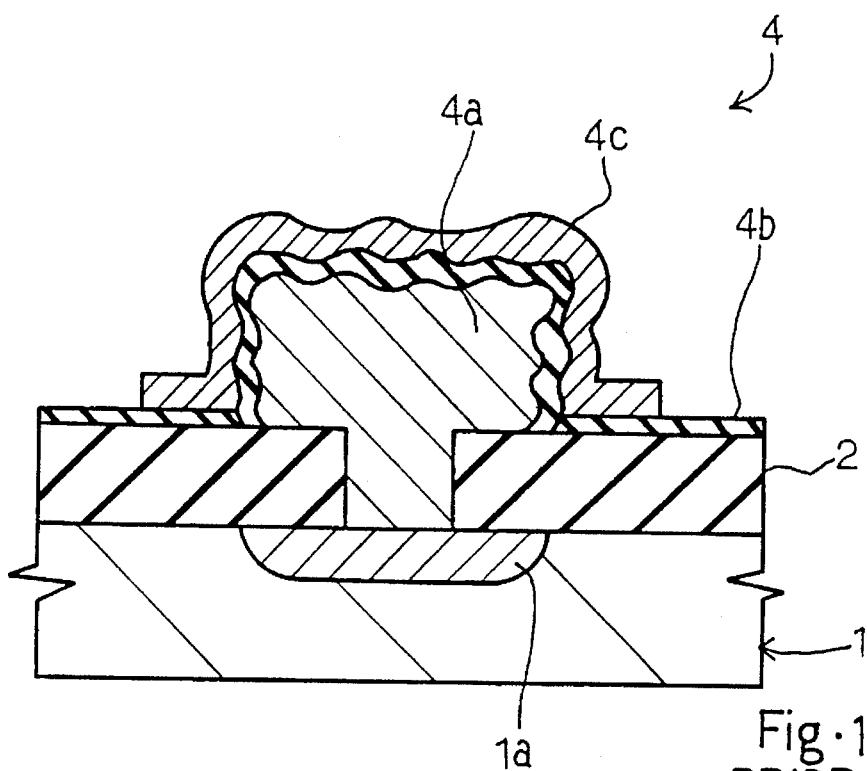
Figure 2A:
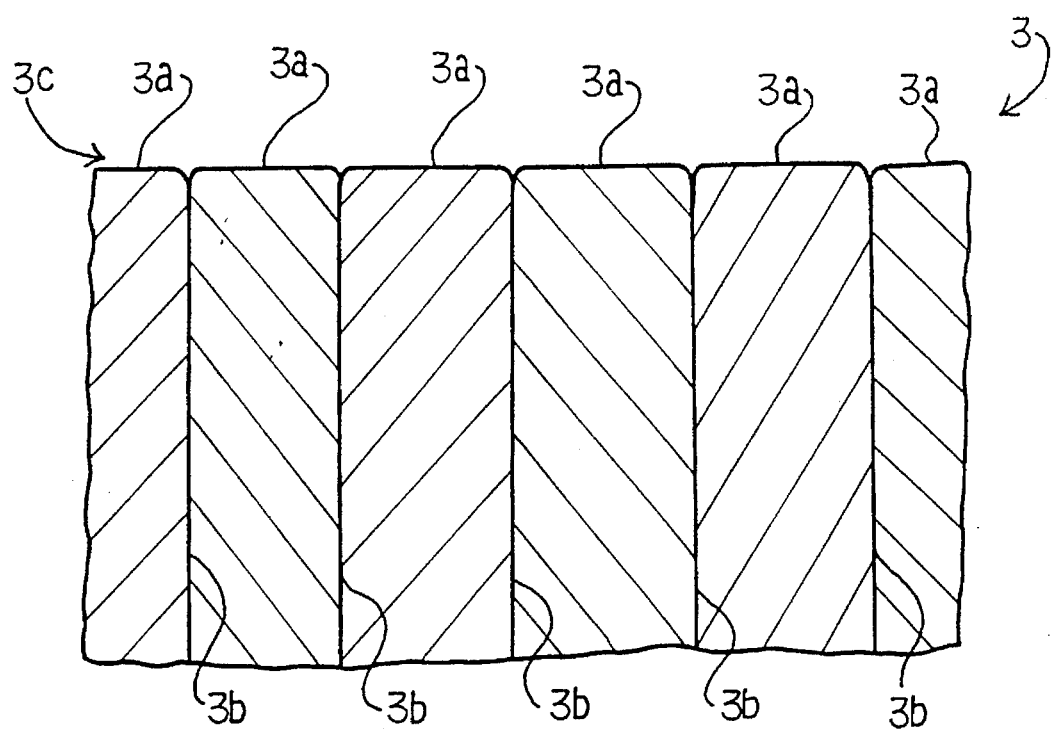
FIGS. 2A to 2C are schematic cross sectional views showing the roughening sequence incorporated in the prior art process sequence.
Figure 2B:
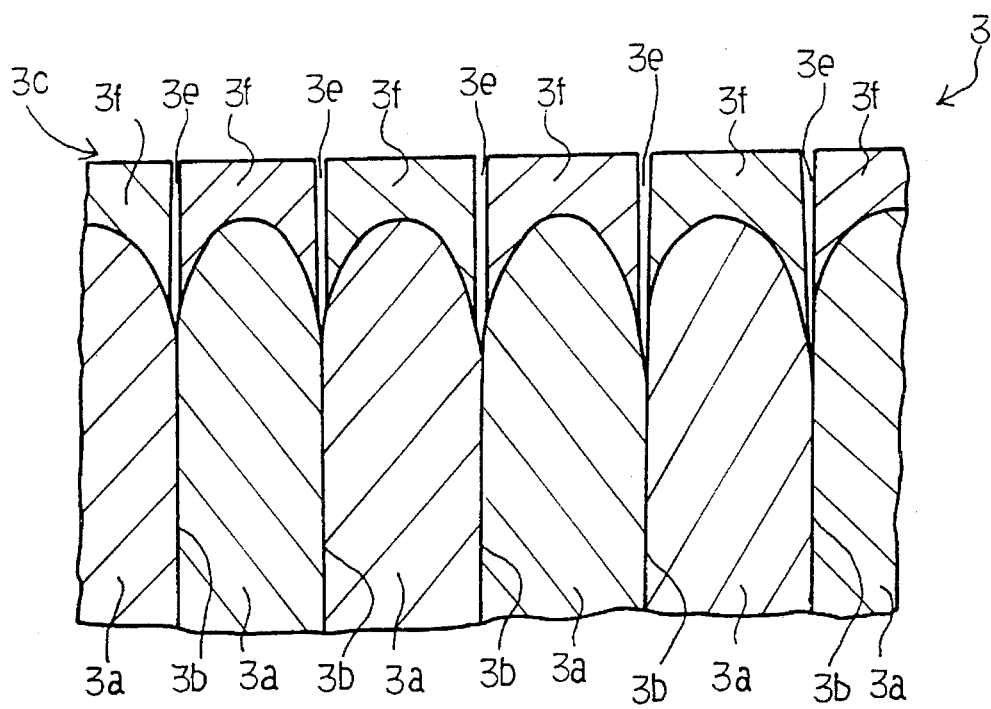
Figure 2C:
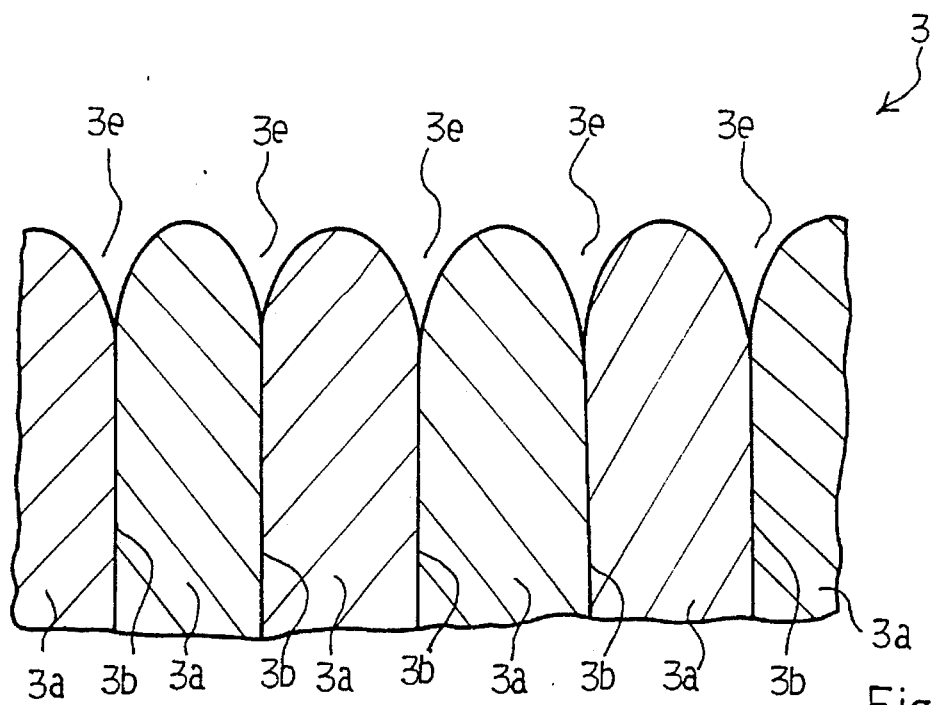

FIGS. 3A to 3D illustrate a process sequence for fabricating a dynamic random access memory cell embodying the present invention. The process embodying the present invention starts with preparation of a p-type silicon substrate 11, and a thick field oxide layer (not shown) is selectively grown on the major surface of the p-type silicon substrate 11 by using a local oxidation of silicon process. The thick field oxide layer defines a plurality of active areas, and one of the active areas 11a is assigned to a pair of dynamic random access memory cells. However, only one of the dynamic random access memory cells is illustrated in FIGS. 1A to 1D for the sake of simplicity.

A thin gate oxide layer 12a is thermally grown over the active area 11a, and conductive substance is deposited over the entire surface of the structure. A photo-resist mask is provided on the conductive layer of the deposited substance through a lithographic process, and the conductive layer is patterned into a gate electrode 12b on the thin gate oxide layer 12a.

N-type dopant impurity such as arsenic is ion implanted into the active area 11a, and an n-type source region 12c and an n-type drain region 12d are formed in a self-aligned manner with the gage electrode 12b. The thin gate oxide layer 12a, the gate electrode 12b, the n-type source region 12c and the n-type drain region 12d as a whole constitute an n-channel enhancement type switching transistor 12, and the n-channel enhancement type switching transistor 12 forms in combination the dynamic random access memory cell together with a storage capacitor 13.

Silicon oxide is deposited over the n-channel enhancement type switching transistor 12 by using a chemical vapor deposition, and forms a silicon oxide layer. A smooth surface is created on the silicon oxide layer through a chemical-mechanical polishing, and an inter-level insulating layer 14 is completed. In this instance, the inter-level insulating layer 14 is 1 micron in thickness.

Subsequently, an appropriate photo-resist mask (not shown) is formed on the inter-level insulating layer 14, and exposes a part of the inter-level insulating layer 14 over the n-type source region 12c. The exposed inter-level insulating layer 14 is etched away by using a dry etching, and a contact hole 14a is formed in the inter-level insulating layer 14. The n-type source region 12c is partially exposed to the contact hole 14a.

The resultant structure is placed in a reactor of a low-pressure chemical vapor deposition system (not shown), and gaseous mixture of $SiH_4$ and $N_2$ is introduced into the reactor. The reactor is maintained at 1 torr, and silane, i.e., $SiH_4$ is decomposed in the reactor at 600 degrees to 650 degrees in centigrade. Polysilicon is deposited over the inter-level insulating layer 14 at 15 to 20 nanometers per minute. The polysilicon is grown to 200 nanometers thick, and forms a first polysilicon layer 15a.

When the first polysilicon layer 15a reaches 200 nanometers thick, ammonia gas is mixed into the gaseous mixture of $SiH_4$ and $N_2$ for 30 seconds, and is regulated to 1 to 10 percent of the silane gas. As a result, the first polysilicon layer 15a is covered with a first boundary layer 15b. The first boundary layer 15b is extremely thin, and is equal to or less than 1 nanometer thick in this instance. The first boundary layer 15b is formed of silicon nitride or the nitride-containing polysilicon.

When the first boundary layer 15b is formed on the first polysilicon layer 15a, the low-pressure chemical vapor deposition system stops the ammonia gas, and continuously supplies the gaseous mixture of silane and nitrogen to the reactor. Then, the polysilicon is deposited on the first boundary layer 15b again, and a second polysilicon layer 15c is grown to 200 nanometers thick over the first boundary layer 15b.

The first boundary layer 15b intercepts the crystal growth of the polysilicon, and the second polysilicon layer 15c is grown from crystal seeds on the first boundary layer 15b. For this reason, the crystal grains of the first and second polysilicon layers 15a and 15c are smaller than crystal grains of a polysilicon layer continuously grown without the first boundary layer 15b.

When the second polysilicon layer 15c reaches 200 nanometers thick, the ammonia gas is mixed into the gaseous mixture of silane and nitrogen again, and a second boundary layer 15d is formed on the second polysilicon layer 15c as similar to the first boundary layer 15b. The second boundary layer 15d is formed of the same substance as the first boundary layer 15b, and the thickness is equal to the first boundary layer 15b.

When the second boundary layer 15d is formed, the low-pressure chemical vapor deposition system stops the ammonia gas, and continuously supplies the gaseous mixture of silane and nitrogen so as to deposit a third polysilicon layer 15e on the second boundary layer 15d. The third polysilicon layer 15e is 200 nanometers thick.

Figure 4:
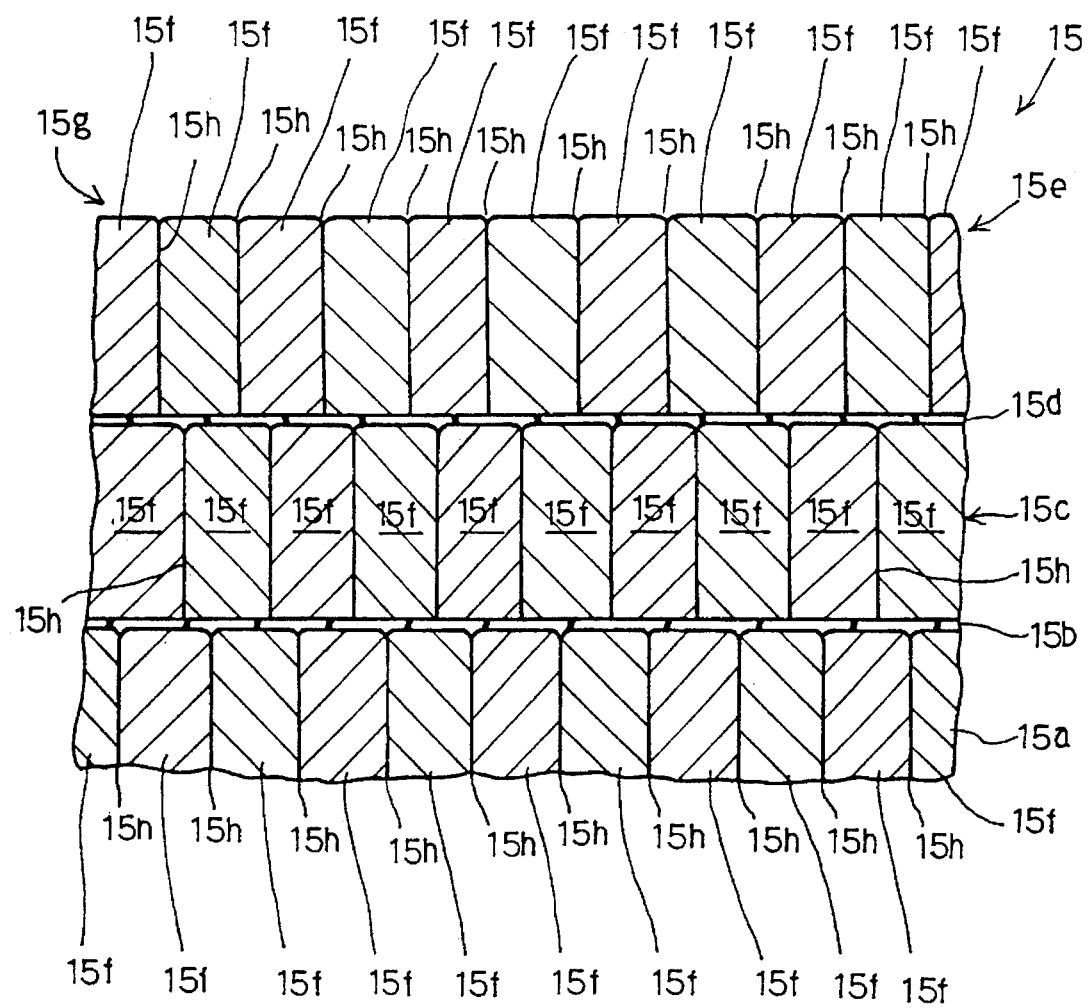
FIG. 4 is a schematic view showing a multi-level polysilicon structure.

The second boundary layer 15d intercepts the crystal growth of the polysilicon, and the third polysilicon layer 15e restarts the crystal growth from seeds on the second boundary layer 15d. Thus, the growth of polysilicon is twice intercepted by the first and second boundary layers 15b and 15d, and discontinuity takes place between grains 15f of the first and second polysilicon layers 15a and 15c and between grains of the second and the third polysilicon layers 15c and 15e as shown in FIG. 4. As a result, the grain size on the top surface 15g is decreased to a half of the grain size of a polysilicon layer of the same thickness grown without the boundary layers.

Figure 3A:
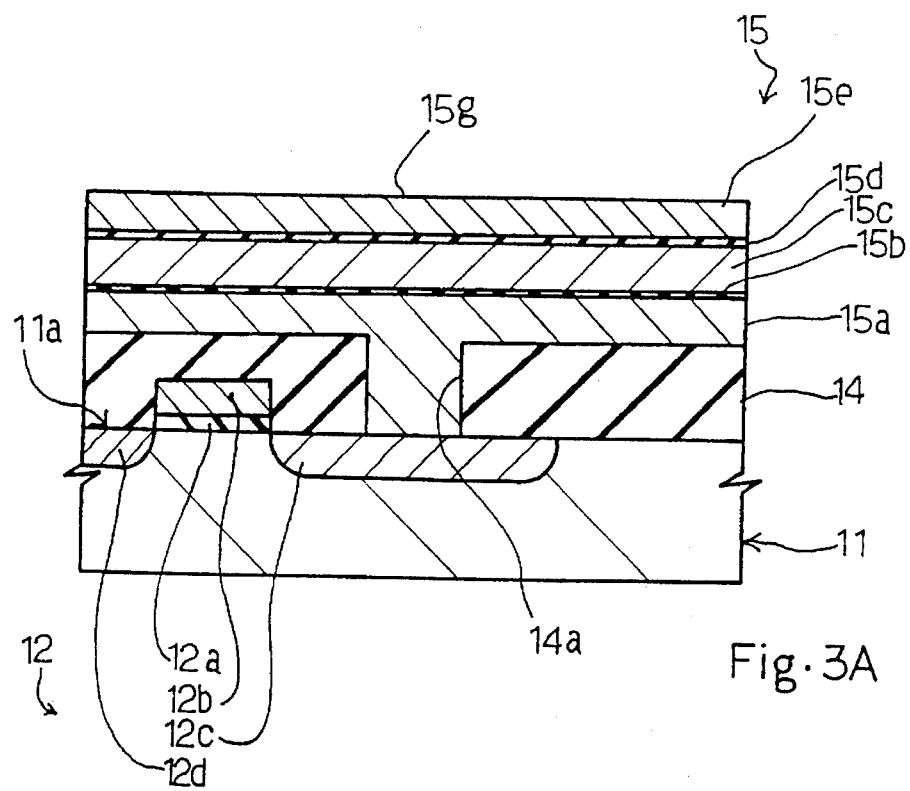
FIGS. 3A to 3D are schematic cross sectional views showing a process sequence according to the present invention.

The first to third polysilicon layers 15a, 15b and 15c and the first and second boundary layers 15b and 15d as a whole constitute a multi-level polysilicon structure 15. The resultant structure of this stage is illustrated in FIG. 3A.

Subsequently, an appropriate photo-resist mask (not shown) is formed on the top surface 15f of the multi-level polysilicon structure 15 by using lithographic techniques, and the multi-level polysilicon structure 15 is patterned into a multi-level polysilicon strip structure 16 by using a dry etching. The multi-level polysilicon strip structure 16 contains a first polysilicon strip 16a, a second polysilicon strip 16b and a third polysilicon strip 16c corresponding to the first polysilicon layer 15a, the second polysilicon layer 15b and the third polysilicon layer 15c, respectively, and the first boundary layer 15b and the second boundary layer 15d are left in the multi-level polysilicon strip structure 16.

Figure 3B:
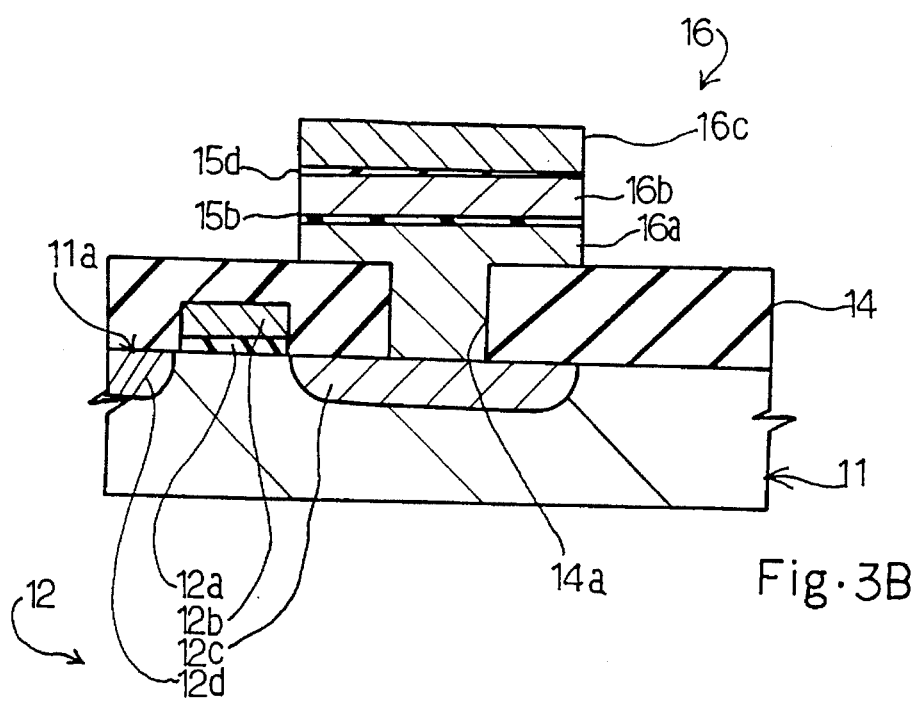

Phosphorous is thermally diffused into the multi-level polysilicon strip structure 16. The thermal diffusion is carried our at not higher than 850 degrees in centigrade so as to prevent the crystal grains 15f from recrystallization. For this reason, the grain size is not increased during the thermal diffusion. The other conditions are regulated in such a manner that the phosphorous concentration ranges from $2\times10^{20}$ $cm^{-3}$ to $4\times10^{20}$ $cm^{-3}$ The resultant structure of this stage is illustrated in FIG. 3B.

Subsequently, the multi-level polysilicon strip structure 16 is roughened. Namely, the upper and side surfaces of the multi-level polysilicon strip structure 16 are roughened by deep crevasses 16e along grain boundaries 15h (see FIG. 4) and the first and second boundary layers 15b and 15d.

In detail, the roughening is implemented by two stage etching. First, the p-type silicon substrate 11 is dipped into an etchant having a selectivity between a heavily phosphorous-doped polysilicon and a lightly phosphorous-doped polysilicon. In this instance, hot phosphoric acid at 150 degrees to 200 degrees in centigrade is used in the first roughening stage, and the hot phosphoric acid selectively etches the heavily phosphorous-doped polysilicon for 30 minutes.

The phosphorous has been segregated along grain boundaries 15h and crystal defects in the first to third polysilicon strips 16a to 16c and in the first and second boundary layers 15b and 15d. As a result, deep crevasses 16e take place along the grain boundaries 15f and the first and second boundary layers 15b and 15d, and the surfaces of the first to third polysilicon strips 16a to 16c become porous.

Figure 3C:
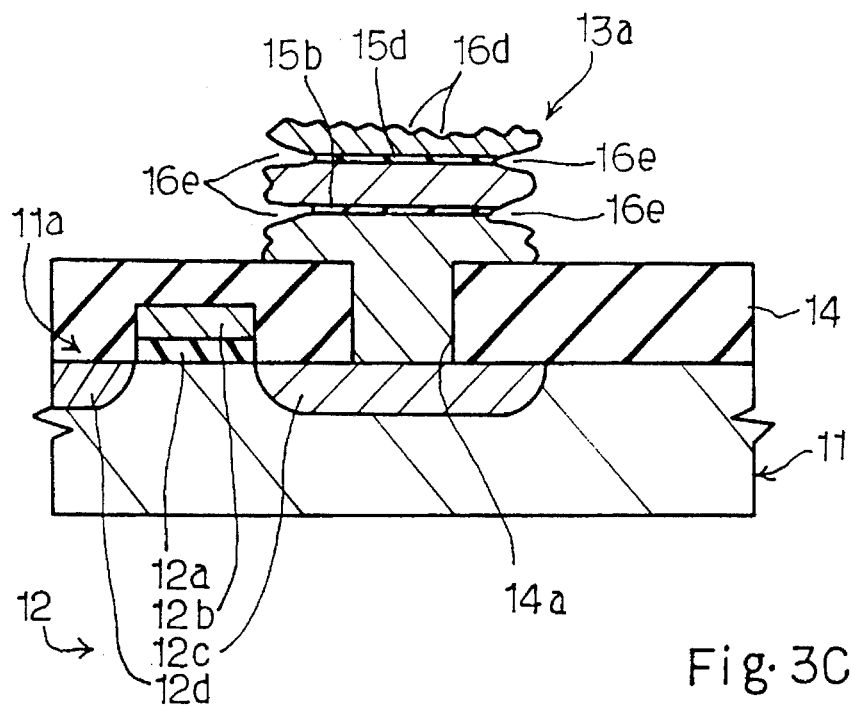

A mixture of ammonia and hydrogen peroxide is diluted in pure water so as to prepare an etchant for the second roughening stage. The etchant removes the porous polysilicon from the multi-level polysilicon strip structure 16. The second roughening stage widens the deep crevasses 16e, and smoothens the surfaces defining the deep crevasses 16e along the first and second boundary layers 15b and 15d. Thus, an accumulating electrode 13a is formed from the multi-level polysilicon strip structure 16, and the resultant structure of this stage is illustrated in FIG. 3C.

The accumulating electrode 13a has been unintentionally covered with a thin natural oxide film (not shown), and the natural oxide is removed from the accumulating electrode 13a in diluted fluoric acid.

Subsequently, silicon nitride is deposited to 5 to 10 nanometers thick by using a chemical vapor deposition, and forms a dielectric film 13b. The dielectric film 13b topographically extends over the rough surface of the accumulating electrode 13a, and serves as a dielectric film structure.

Figure 3D:
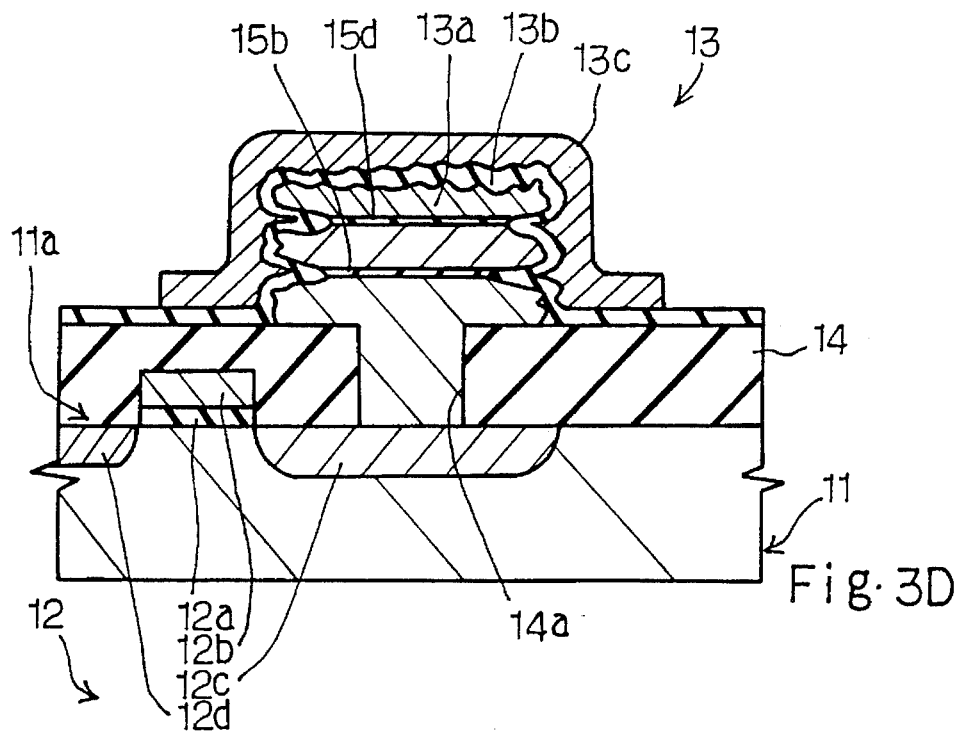

Polysilicon is deposited over the entire surface of the structure, and phosphorous is doped into the polysilicon layer. The phosphorous-doped polysilicon layer is patterned through lithographic techniques, and is formed into a counter electrode 13c as shown in FIG. 3D.

The accumulating electrode 13a, the dielectric film 13b and the counter electrode 13c as a whole constitute the storage capacitor 13. Although the first and second boundary layers 15b and 15d remain in the accumulating electrode 13a, the first and second boundary layers 15b and 15d are so thin, i.e., not greater than 1 nanometer thick that they do not deteriorate the electric characteristics of the storage capacitor 13.

The accumulating electrode 13a is three to four times wider in surface area than an accumulating electrode without the roughening process.

Figure 5A:
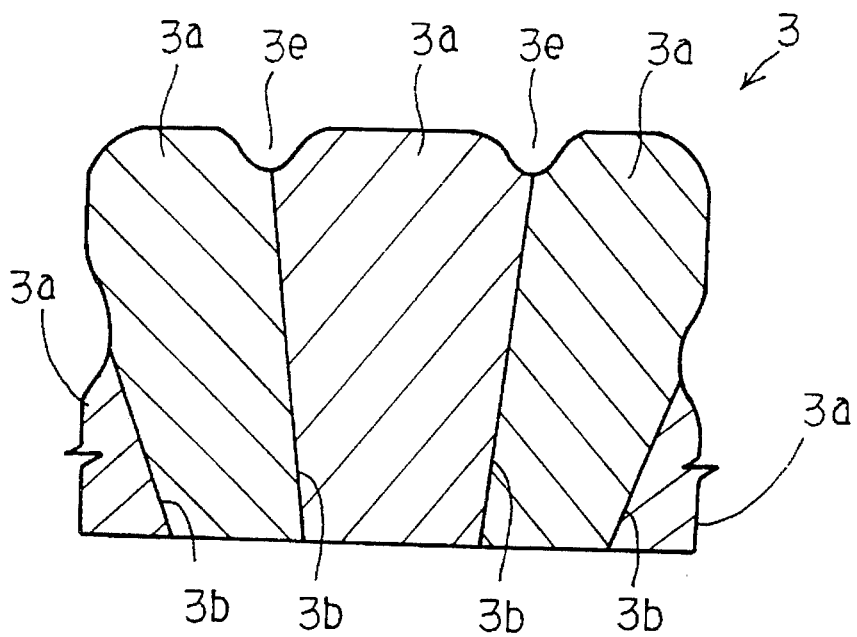
FIG. 5A is a schematic cross sectional view showing the prior art accumulating electrode.
Figure 5B:
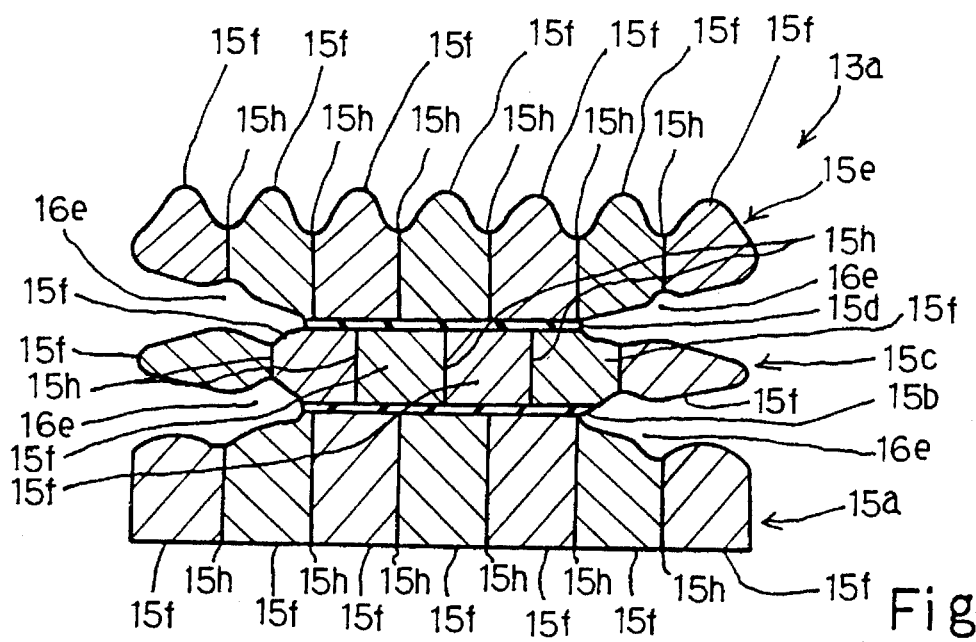
FIG. 5B is a schematic cross sectional view showing an accumulating electrode of a capacitor fabricated through the process according to the present invention.

FIGS. 5A and 5B illustrate the prior art accumulating electrode subjected to the two-stage roughening process and the accumulating electrode 13a. The crystal grains 3a form the prior art accumulating electrode. The crystal grains 3a are so high that the grain size is very large. This results in a small amount of grain boundaries 3b.

On the other hand, the first and second boundary layers. 15b and 15d do not allow the crystal grains 15f to be continuously grown, and the crystal grains 15f are lower than the crystal grains 3a. For this reason, the grain size of the first to third polysilicon layers 15a, 15c and 15e are smaller than the grain size of the prior art accumulating electrode, and the grain boundaries 15h are more than the grain boundaries 3b. Thus, even if the multi-level polysilicon structure 15 is increased in thickness, the crystal grains 15f are not enlarged, and side surface becomes wide without sacrifice of the grain size. Moreover, the phosphorous tends to segregate along the first and second boundary layers 15b and 15d, and the deep crevasses 16e take place on the side surface of the accumulating electrode 13a. As a result, the storage capacitor 13 is drastically increased in capacitance, and is available for the dynamic random access memory cell of the next generation.

In the above described embodiment, ammonia gas is supplied to the reactor together with the gaseous mixture of silane and nitrogen, and the silicon nitride or the polysilicon containing the silicon nitride forms the first and second boundary layers 15b and 15d. The ammonia gas is replaceable with $N_2O$ gas or $O_2$ gas. If the $N_2O$ or $O_2$ is used in the process, the first and second boundary layers 15b and 15d are formed of oxygen or silicon oxide.

As will be understood from the fore going description, the boundary layers restrict the height of the crystal grains 15f, and increases the grain boundaries 15h. The surface of the multi-level polysilicon strip structure is roughened along the grain boundaries and the boundary layers, and the increased grain boundaries result in a large amount of surface area. Thus, the process according to the present invention drastically increases the surface area of the accumulating electrode 13a, and, accordingly, enlarges the capacitance of the storage capacitor.

Second Embodiment

FIGS. 6A to 6D illustrate another process sequence embodying the present invention. The process starts with preparation of a p-type silicon substrate 21, and an n-type impurity region 21a is formed in a surface portion of the p-type silicon substrate 21. Silicon oxide is deposited to 500 nanometers to 1 micron thick by using the chemical vapor deposition, and the silicon oxide layer is smoothened by using the chemical mechanical polishing. As a result, the major surface of the p-type silicon substrate 21 is covered with an inter-level insulating layer 22.

An appropriate photo-resist mask (not shown) is formed on the inter-level insulating layer 22, and a contact hole 22a is formed through a dry etching process in an area exposed to the photo-resist mask.

Figure 6A:
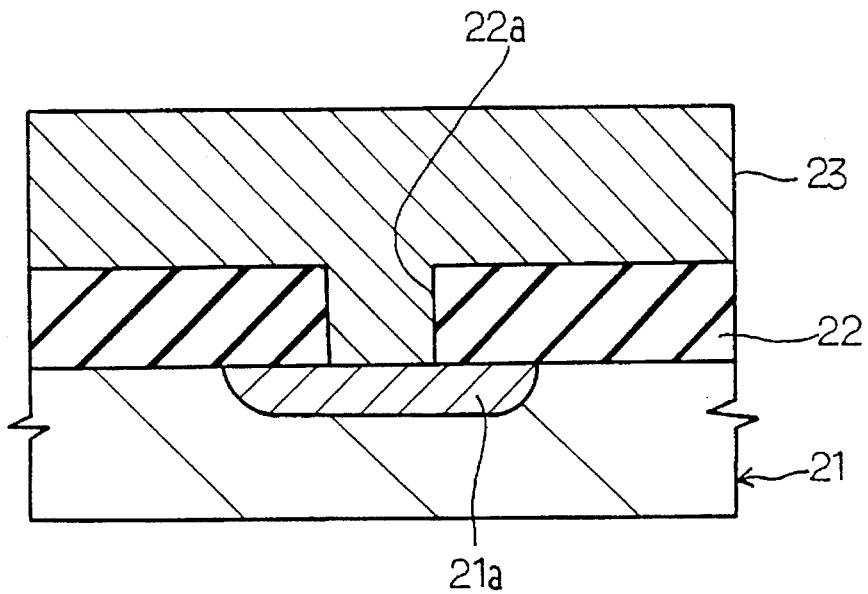
FIGS. 6A to 6D are schematic cross sectional view showing another process sequence according to the present invention.

Subsequently, the p-type silicon substrate 21 is placed in a reactor (not shown) of a low-pressure chemical vapor deposition system, and gaseous mixture is supplied to the reactor. The gaseous mixture contains $SiH_4$ at 1000 sccm, $PH_3$ at 150 sccm, $N_2O$ at 20 sccm and either $N_2$ or He. The gaseous mixture is regulated to 1 torr, and the reactor is maintained at 550 to 600 degrees in centigrade. Phosphorous-doped amorphous silicon is deposited to 600 nanometers thick over the inter-level insulating layer 22, and the phosphorous-doped amorphous silicon layer 23 is held in contact with the n-type impurity region 21a through the contact hole 22a as shown in FIG. 6A.

Figure 6B:
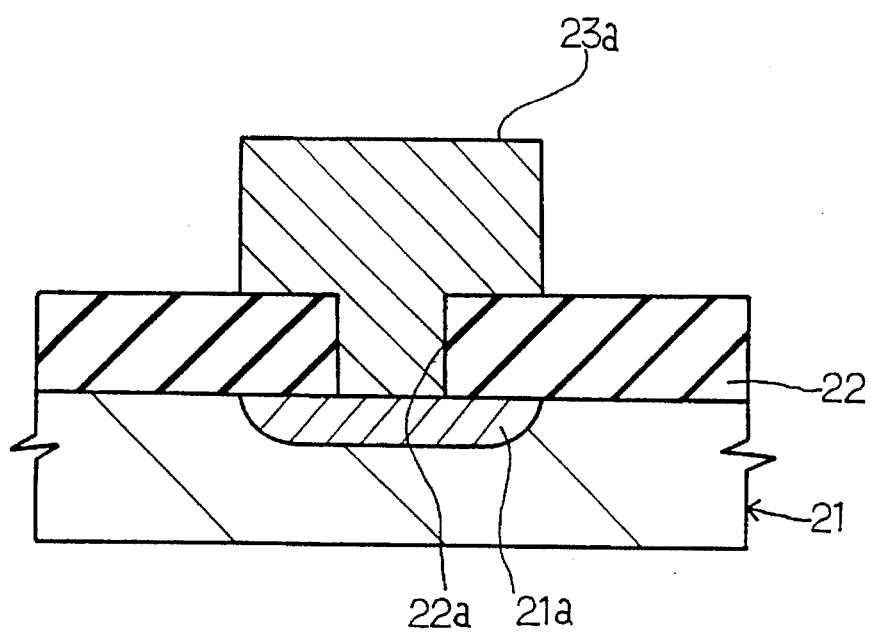

An appropriate photo-resist mask (not shown) is formed on the phosphorous-doped amorphous silicon layer 23, and the amorphous silicon layer 23 uncovered with the photo-resist mask is removed by using a dry etching. As a result, an amorphous silicon strip 23a is patterned from the inter-level insulating layer 22 as shown in FIG. 6B. In this instance, the amorphous silicon strip 23a is 0.35 micron in length, 0.7 micron in width and 0.6 micron in height.

The amorphous silicon strip 23a is subject to a heat treatment in nitrogen atmosphere at 800 to 900 degrees in centigrade for 30 minutes, And the amorphous silicon is crystallized during the heat treatment. Thus, the amorphous silicon strip 23a is converted to a phosphorous-doped polysilicon strip 23b, and the means grain size is equal to or less than 20 nanometers. While the amorphous silicon is crystallizing, a compound containing a small amount of oxygen is precipitated along the grain boundaries and in the crystal grains of the phosphorous-doped polysilicon, and promotes segregation of phosphorous. As a result, a large amount of phosphorous is segregated around the compound containing a small amount of oxygen.

Subsequently, the phosphorous-doped polysilicon strip 23b is roughened through the two-stage roughening process as similar to the first embodiment. In detail, the p-type silicon substrate 21 is dipped into hot phosphoric acid at 150 degrees to 200 degrees in centigrade for an hour, and the hot phosphoric acid selectively etches the heavily phosphorous-doped polysilicon. As a result, the entire surface of the phosphorous-doped polysilicon becomes porous.

Figure 6C:
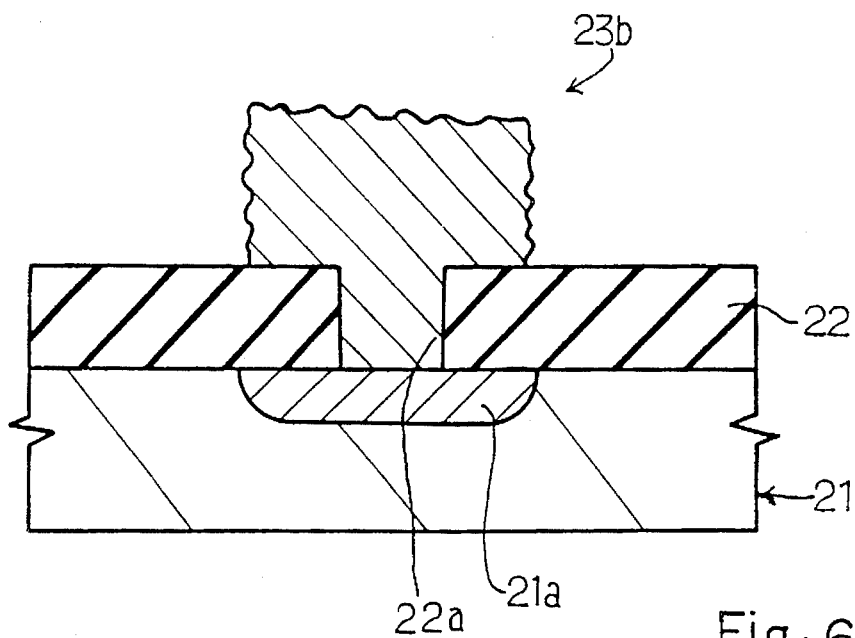

A mixture of ammonia and hydrogen peroxide is diluted in pure water so as to prepare an etchant for the second roughening stage. The etchant removes the porous polysilicon, and roughens the phosphorous-doped polysilicon strip 23b as shown in FIG. 6C. The phosphorous-doped polysilicon strip 23b thus roughened serves as an accumulating electrode 24a of a storage capacitor 24.

The accumulating electrode 24a has been unintentionally covered with a thin natural oxide film (not shown), and the natural oxide is removed from the accumulating electrode 24a in diluted fluoric acid.

Subsequently, silicon nitride is deposited to 5 to 10 nanometers thick by using a chemical vapor deposition, and forms a dielectric film 24b. The dielectric film 24b topographically extends over the rough surface of the accumulating electrode 24a, and serves as a dielectric film structure.

Figure 6D:
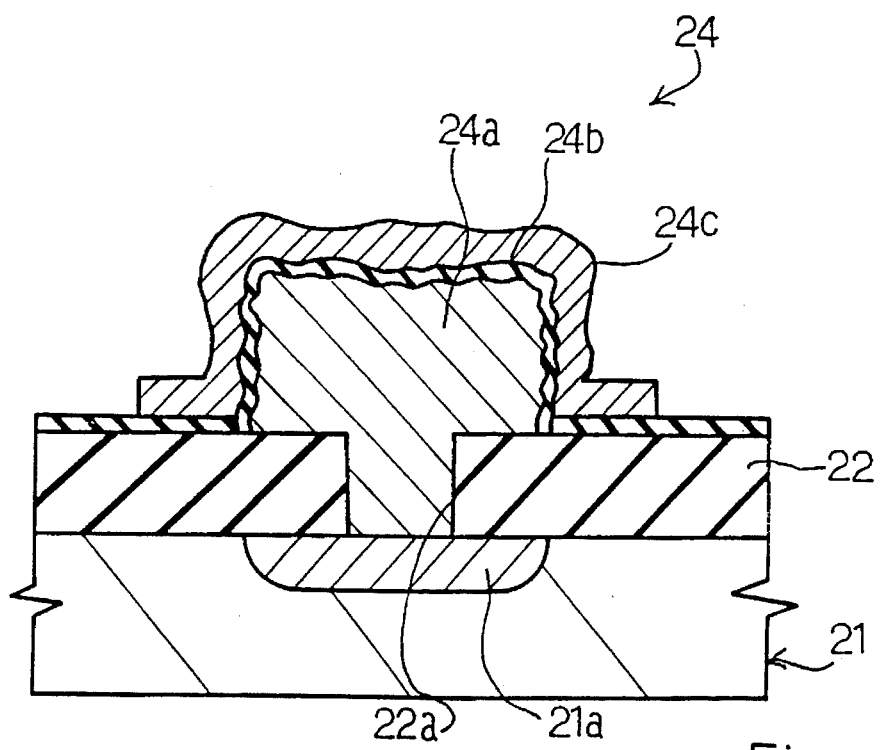

Polysilicon is deposited over the entire surface of the structure, and phosphorous is doped into the polysilicon layer. The phosphorous-doped polysilicon layer is patterned through lithographic techniques, and is formed into a counter electrode 24c as shown in FIG. 6D.

The accumulating electrode 24a, the dielectric film 24b and the counter electrode 24c as a whole constitute the storage capacitor 24.

The two-stage roughening process twice to three times increases the surface area of the phosphorous doped polysilicon strip 23b. If the grain size is decreased, the surface area is increased more than three times.

Figure 7:
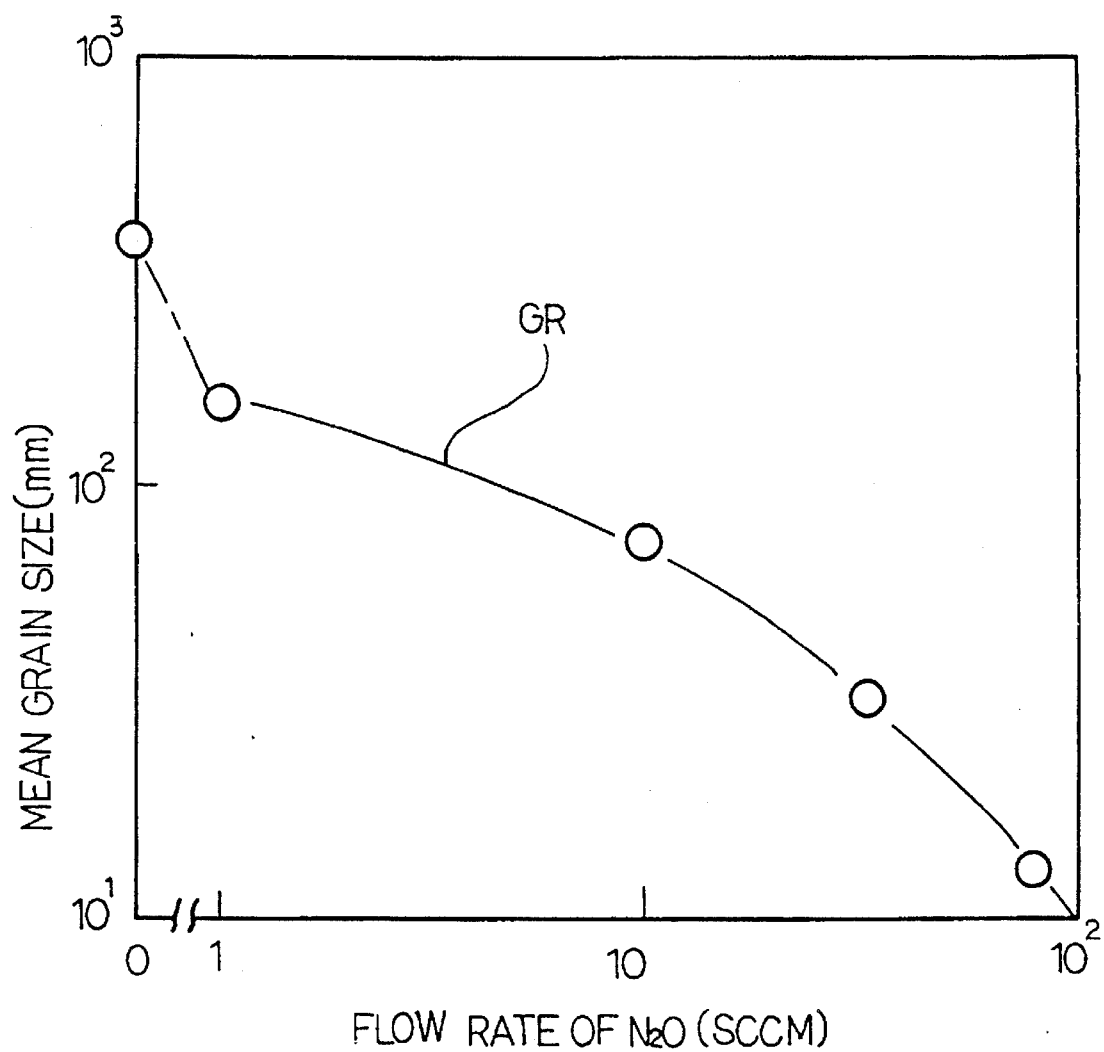
FIG. 7 is a graph showing relation between a flow rate of $N_2O$ and the grain size of deposited silicon.

The grain size is variable depending upon the depositing conditions of the amorphous silicon. FIG. 7 illustrates the relation between the flow rate of $N_2O$ gas and the grain size. $SiH_4$ gas and $PH_3$ gas were fixed to 1000 sccm and 150 sccm, respectively, and the gaseous mixture was regulated to 1 torr. The deposition was carried out at 600 degrees in centigrade, and the amorphous silicon layer was subjected to the heat treatment at 850 degrees in centigrade for 30 minutes. The grain size was measured, and was plotted in FIG. 7.

As will be understood from Plots GR, the grain size of the polysilicon is inversely proportional to the flow rate of $N_2O$ gas.

If the $N_2O$ gas was regulated to 80 sccm, the grain size was of the order of 10 nanometers, and the resistivity of the polysilicon was $5\times10^{-2}$ ohm-cm low enough to serve as the accumulating electrode. The grain size of 10 nanometers increased the surface area three to four times.

In the second embodiment, the process gas is decomposed at 550 degrees to 600 degrees in centigrade, and the amorphous silicon is deposited. However, if the reactor is heated to or over 650 degrees in centigrade, the phosphorous-doped polysilicon layer is directly deposited, and the phosphorous-doped polysilicon layer is patterned into the phosphorous-doped polysilicon strip. The process is simpler than the second embodiment. Although the grain size of the directly deposited polysilicon layer is not constant, the $N_2$ gas also affects the grain size, and makes the grain size smaller than that of the polysilicon deposited without $N_2O$ gas. The smaller grain size increases the grain boundaries, and the surface area is widened through the two-stage roughening process. Thus, the second embodiment is not limited to the amorphous silicon.

In the second embodiment, the phosphorous is doped into the amorphous silicon through the in-situ doping. However, if the gaseous mixture contains $SiH_4$, $N_2O$ and $N_2$ only, non-doped amorphous silicon or non-doped polysilicon is deposited depending upon the temperature, and an n-type dopant impurity is diffused after the deposition. In this case, the mean grain size is not greater than 10 nanometers, and the grain boundaries are further increased. In fact, the two-stage roughening process increases the surface area of an accumulating electrode at 50 percent with respect to the accumulating electrode 24a formed through the process shown in FIGS. 6A to 6D.

If the non-doped amorphous silicon is deposited, the non-doped amorphous silicon layer is patterned, then converting the non-doped amorphous silicon strip to a non-doped polysilicon strip, finally thermally diffusing phosphorous into the non-doped polysilicon strip. On the other hand, if the non-doped polysilicon is deposited, the non-doped polysilicon layer is patterned into a non-doped polysilicon strip, and phosphorous is thermally diffused into the non-doped polysilicon strip.

As will be understood from the foregoing description, $N_2O$ decreases the grain size of the polysilicon, and, accordingly, increases the grain boundaries. The roughening process forms crevasses along the grain boundaries, and the crevasses increases the surface area. Therefore, the $N_2O$ increases the surface area of the accumulating electrode and, accordingly, the capacitance of the storage capacitor.

Although particular embodiments of the present invention have been shown and described, it will be obvious to those skilled in the art that various changes and modifications may be made without departing from the spirit and scope of the present invention.

For example, the number of boundary layers is determined by the total thickness of the multi-level polysilicon structure. Therefore, only two polysilicon layers and a single boundary layer may be incorporated in the multi-level polysilicon structure, or more than three polysilicon layers intercepted by more than two boundary layers may form the multi-level polysilicon structure.

Another element of the group V or group III such as, for example, arsenic may be introduced into the multi-level polysilicon structure, and the group-V/group III element may be introduced into the polysilicon layers through in-situ doping using $PH_3$ gas. The in-situ doping tends to increase the grain size. However, the increment of the grain size is about 10 percent, and is ignoreable.

The etchants available for the two-stage roughening are not limited to the hot phosphoric acid and the mixture of ammonia and hydrogen peroxide. Any etchant selective removing a heavily doped polysilicon is available for the first stage, and a water solution of hydrogen fluoride, nitric acid and glacial acetic acid is one of the etchants available for the first stage. A dry etching is also available for selectively removing a heavily doped polysilicon, and plasma containing $CCl_2$, $F_2$ and $N_2$ may used in the dry etching.

Another etchant small in impurity concentration dependency is available for the second stage of the roughening process. A mixture of diluted hydrogen fluoride and nitric acid is the etchant available for the second stage. A dry etchant is also available for the second roughening stage, and plasma containing $CF_4$ and $O_2$ and $SF_6$ plasma are examples of the dry etchant.

The dielectric film structure may be implemented by a combination of a silicon nitride layer and a silicon oxide layer.

Although the nitrogen or the oxygen is mixed into the process gas during the deposition of polysilicon in the above described embodiments, carbon is also available for restricting the crystal growth.

Finally, the capacitor fabricated through the process according to the present invention may be incorporated in not only a dynamic random access memory device but also any kind of integrated circuit.

What is claimed is:

1. A process of fabricating a semiconductor device, comprising the steps of:
   a) introducing an element selected from the group consisting of oxygen, nitrogen and carbon into a polysilicon layer during a period of a deposition of said polysilicon layer;
   b) exposing a surface of said polysilicon layer to an etchant so as to roughen said surface;
   c) covering said surface of said polysilicon layer with a dielectric layer; and
   d) covering said dielectric layer with a conductive layer.

2. A process of fabricating a semiconductor device, comprising the steps of:
   a) preparing a semiconductor structure;
   b) forming a multi-level polysilicon strip structure over said semiconductor structure and including a plurality of polysilicon strips doped with a dopant impurity of group V or group III and at least one boundary strip inserted between two of said plurality of polysilicon strips so as to intercept a crystal growth of polysilicon between said two of said plurality of polysilicon strips;
   c) roughening surfaces of said multi-level polysilicon strip structure by forming deep crevasses along grain boundaries of said polysilicon, thereby forming an accumulating electrode;
   d) covering said accumulating electrode with a dielectric film structure; and
   e) covering said dielectric film structure with a counter electrode so as to complete a capacitor.

3. The process as set forth in claim 2, in which said step b) includes the sub-steps of
   b-1) placing said semiconductor structure into a reactor of a deposition system,
   b-2) supplying a process gas to said reactor so as to deposit a first polysilicon layer,
   b-3) mixing ammonia gas into said process gas so as to deposit a boundary layer of a substance selected from the group consisting of silicon nitride and polysilicon containing silicon nitride on said first polysilicon layer, and
   b-4) stopping said ammonia gas so as to deposit a second polysilicon layer;
   b-5) patterning said first polysilicon layer, the boundary layer and said second polysilicon layer into said two of said plurality of polysilicon strips and said at least one boundary strip.

4. The process as set forth in claim 3, in which said at least one boundary layer is equal to or less than 1 nanometer thick.

5. The process as set forth in claim 3, in which said process gas contains silane gas, and a flow rate of said ammonia gas is one to ten percent of a flow rate of said silane gas so as to deposit said boundary layer to not greater than 1 nanometer thick.

6. The process as set forth in claim 2, in which said step b) includes the sub-steps of
   b-1) placing said semiconductor structure into a reactor of a deposition system,
   b-2) supplying a process gas to said reactor so as to deposit a first polysilicon layer,
   b-3) mixing one of $NO_2$ gas and $O_2$ gas into said process gas so as to deposit a boundary layer of a substance selected from the group consisting of oxygen and silicon oxide on said first polysilicon layer,
   b-4) stopping said one of said $NO_2$ gas and $O_2$ gas so as to deposit a second polysilicon layer on said boundary layer, and
   b-5) patterning said first polysilicon layer, the boundary layer and said second polysilicon layer into said two of said plurality of polysilicon strips and said at least one boundary strip.

7. The process as set forth in claim 2, in which said step d) includes the sub-steps of
   d-1) etching said multi-level polysilicon strip structure by using an etchant having a large selectivity between a headily doped polysilicon and a lightly doped polysilicon so as to form crevasses along said grain boundaries and said at least one boundary strip and micro-recesses in surface portions of said plurality of polysilicon strips, and
   d-2) etching said surface portions by using little selectivity between said lightly doped polysilicon and said heavily doped polysilicon so as to remove said surface portions and widen said crevasses.

8. The process as set forth in claim 2, in which a field effect transistor is fabricated in said semiconductor structure before said step a) so as to form a dynamic random access memory cell together with said capacitor.

9. A process of fabricating a semiconductor device, comprising the steps of:
   a) preparing a semiconductor structure;
   b) forming a polysilicon strip over said semiconductor structure through a vapor phase deposition using a process gas containing $N_2O$ gas so as to decrease a grain size of polysilicon, said polysilicon strip being doped with an element of group V or group III segregated along grain boundaries of said polysilicon strip;
   c) roughening surfaces of said polysilicon strip by forming deep crevasses along said grain boundaries, thereby forming an accumulating electrode from said polysilicon strip;
   d) covering said accumulating electrode with a dielectric film structure; and
   e) covering said dielectric film structure with a counter electrode so as to complete a capacitor.

10. The process as set forth in claim 9, in which said step b) includes the sub-steps of
    b-1) placing said semiconductor structure into a reactor of a vapor phase deposition system,
    b-2) supplying said process gas containing said $N_2O$ gas, a silicon source gas, a dopant impurity source gas and an inert carrier gas to said reactor so as to deposit a doped amorphous silicon layer over said semiconductor structure,
    b-3) patterning said doped amorphous silicon layer into a doped amorphous silicon strip, and b-4) heating said doped amorphous silicon strip so as to convert said amorphous silicon strip to said polysilicon strip doped with said element of group V or group III.

11. The process as set forth in claim 10, in which said silicon source gas and said dopant impurity source gas are $SiH_4$ and $PH_3$, and said $SiH_4$ is decomposed at 550 degrees to 600 degrees in centigrade at 1 torr.

12. The process as set forth in claim 10, in which said doped amorphous silicon strip is converted to said polysilicon strip in an inert gas atmosphere at 800 degrees to 900 degrees in centigrade.

13. The process as set forth in claim 9, in which said step b) includes the sub-steps of b-1) placing said semiconductor structure into a reactor of a vapor phase deposition system, b-2) supplying said process gas containing said $N_2O$ gas, a silicon source gas, a dopant impurity source gas and an inert carrier gas to said reactor so as to deposit a doped polysilicon layer over said semiconductor structure, and b-3) patterning said doped polysilicon layer into said polysilicon strip doped with said element of group V or group III.

14. The process as set forth in claim 13, in which said silicon source gas and dopant impurity source gas are $SiH_4$ and $PH_3$, and said $SiH_4$ is decomposed at 650 degrees in centigrade or higher than 650 degrees in centigrade.

15. The process as set forth in claim 9, in which said step b) includes the sub-steps of b-1) placing said semiconductor structure into a reactor of a vapor phase deposition system, b-2) supplying said process gas containing said $N_2O$ gas, a silicon source gas and an inert carrier gas to said reactor so as to deposit a non-doped amorphous silicon layer over said semiconductor structure, and b-3) patterning said doped amorphous silicon layer into a non-doped amorphous silicon strip;

b-4) converting said non-doped amorphous silicon strip to a non-doped polysilicon strip; and b-5) introducing said element of group V or group III into said non-doped polysilicon strip.

16. The process as set forth in claim 9, in which said step b) includes the sub-steps of b-1) placing said semiconductor structure into a reactor of a vapor phase deposition system, b-2) supplying said process gas containing said $N_2O$ gas, a silicon source gas and an inert carrier gas to said reactor so as to deposit a non-doped polysilicon layer over said semiconductor structure, and b-3) patterning said non-doped polysilicon layer into a non-doped polysilicon strip; and b-4) introducing said element of group V or group III into said non-doped polysilicon strip.

* * * * *